US010534841B2

(12) United States Patent
Liu et al.

(10) Patent No.: US 10,534,841 B2
(45) Date of Patent: Jan. 14, 2020

(54) APPARTUS AND METHODS FOR SUBMATRIX OPERATIONS

(71) Applicant: Cambricon Technologies Corporation Limited, Beijing (CN)

(72) Inventors: Shaoli Liu, Beijing (CN); Xiao Zhang, Beijing (CN); Yunji Chen, Beijing (CN); Tianshi Chen, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 0 days.

(21) Appl. No.: 16/167,425

(22) Filed: Oct. 22, 2018

(65) Prior Publication Data

US 2019/0057063 A1    Feb. 21, 2019

Related U.S. Application Data

(63) Continuation-in-part of application No. PCT/CN2016/080023, filed on Apr. 22, 2016.

(51) Int. Cl.
  G06F 17/17  (2006.01)
  G06F 17/50  (2006.01)
  G06F 17/16  (2006.01)

(52) U.S. Cl.
  CPC ............ G06F 17/175 (2013.01); G06F 17/16 (2013.01); G06F 17/50 (2013.01)

(58) Field of Classification Search
  None
  See application file for complete search history.

(56) References Cited

U.S. PATENT DOCUMENTS

| 8,473,539 B1* | 6/2013 | Rao ......................... G06F 17/16 708/201 |
| 2008/0028015 A1* | 1/2008 | Seki ........................ G06F 17/16 708/522 |

FOREIGN PATENT DOCUMENTS

| CN | 1584824 A | 2/2005 |
| CN | 103530276 A * | 1/2014 |
| CN | 103530276 A | 1/2014 |
| CN | 103699360 A | 4/2014 |
| WO | WO 2017/181419 A1 | 10/2017 |

OTHER PUBLICATIONS

T. Chen, et al., "A Small-Footprint Accelerator for Large-Scale Neural Networks", ACM Transactions on Computer Systems, vol. 33, No. 2, Article 6, May 2015, 27 pages.
(Continued)

Primary Examiner — Michael D. Yaary
(74) Attorney, Agent, or Firm — Getech Law LLC; Jun Ye

(57) ABSTRACT

Aspects for submatrix operations in neural network are described herein. The aspects may include a controller unit configured to receive a submatrix instruction. The submatrix instruction may include a starting address of a submatrix of a matrix, a width of the submatrix, a height of the submatrix, and a stride that indicates a position of the submatrix relative to the matrix. The aspects may further include a computation module configured to select one or more values from the matrix as elements of the submatrix in accordance with the starting address of the matrix, the starting address of the submatrix, the width of the submatrix, the height of the submatrix, and the stride.

27 Claims, 5 Drawing Sheets

(56) References Cited

OTHER PUBLICATIONS

Z. Du, et al., "An Accelerator for High Efficient Vision Processing", IEEE Transactions on Computer-aided Design of Integrated Circuits and System, vol. 36, No. 2, Feb. 2017, pp. 227-240.
S. Liu, et al., "Cambricon: An Instruction Set Architecture for Neural Networks", 2016 ACM/IEEE 43rd Annual International Symposium on Computer Architecture, Oct. 12, 2016, pp. 393-405.
S. Zhang, et al., "Cambricon-X An Accelerator for Sparse Neural Networks", The 49th Annual IEEE/ACM International Symposium on Microarchitecture Article No. 20, Oct. 15, 2016, 12 pages.
Y. Chen, et al., "DaDianNao: A Machine-Learning Supercomputer", 2014 47th Annual IEEE/ACM International Symposium on Microarchitecture, Dec. 13, 2014, pp. 609-622.
T. Luo, et al., "DaDianNao: A Neural Network Supercomputer", IEEE Transaction on Computers, vol. 66, No. 1, Jan. 2017, pp. 73-88.
T. Chen, et al., "DianNao: A Small-Footprint High-Throughput Accelerator for Ubiquitous Machine-Learning", ASPLOS 14, Proceedings of the 19th international conference on Architectural support for programming languages and operating systems, Feb. 24, 2014, pp. 269-283.
Y. Chen, et al., "DianNao Family: Energy-Efficient Hardware Accelerators for Machine Learning", Communications of the ACM, vol. 59, No. 11, Nov. 2016, pp. 105-112.
D. Liu, et al., "PuDianNao: A Polyvalent Machine Learning Accelerator", ASPLOS '15 Proceedings of the Twentieth International Conference on Architectural Support for Programming Languages and Operating Systems, Mar. 14, 2015, pp. 369-381.
Z. Du, et al., "ShiDianNao: Shifting Vision Processing Closer to the Sensor", ISCA '15 Proceedings of the 42nd Annual International Symposium on Computer Architecture, Jun. 13, 2015, pp. 92-104.
201610258546.6—Office Action, dated May 24, 2019, 9 pages. (no English translation).
PCT/CN2016/080023—International Search Report, dated Jan. 26, 2017, 9 pages. (no English translation).
201810236769.1—Office Action, dated Aug. 7, 2019, 10 pages. (no English translation).
Application No. 16899006.7—Extended European Search Report, dated Oct. 16, 2019, 12 pages.

* cited by examiner

APPARTUS AND METHODS FOR SUBMATRIX OPERATIONS

CROSS-REFERENCE TO RELATED APPLICATIONS

The present invention is a continuation-in-part of PCT Application No. PCT/CN2016/080023, filed on Apr. 22, 2016, which is incorporated herein by reference. The present application also incorporates by reference commonly owned CN application number 201610258546.6, filed on Apr. 22, 2016.

BACKGROUND

Multilayer neural networks (MNN) are widely applied to the fields such as pattern recognition, image processing, functional approximation and optimal computation. In recent years, due to the higher recognition accuracy and better parallelizability, multilayer artificial neural networks have received increasing attention by academic and industrial communities. More specifically, various operations for submatrices may be performed frequently in deep learning processes in MMNs.

A known method to perform various operations for submatrices in a multilayer artificial neural network is to use a general-purpose processor. However, one of the defects of the method is low performance of a single general-purpose processor which cannot meet performance requirements for usual multilayer neural network operations with respect to a submatrix with a large number of elements.

Another known method to perform operations for submatrices of the multilayer artificial neural network is to use a graphics processing unit (GPU). Such a method uses a general-purpose register file and a general-purpose stream processing unit to execute general purpose single-instruction-multiple-data (SIMD) instructions to support the algorithms in MNNs. However, since GPU only contains rather small on-chip caching, then data of the submatrix elements may be repeatedly moved from the off-chip, and off-chip bandwidth becomes a main performance bottleneck, causing huge power consumption.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

One example aspect of the present disclosure provides an example apparatus for submatrix operations in a neural network. The example apparatus may include a controller unit configured to receive a submatrix instruction. The submatrix instruction includes a starting address of a submatrix of a matrix, a width of the submatrix, a height of the submatrix, and a stride that indicates a position of the submatrix relative to the matrix. The example apparatus may further include a computation module configured to select one or more values from the matrix as elements of the submatrix in accordance with the starting address of the submatrix, the width of the submatrix, the height of the submatrix, and the stride.

The example aspect may further include an example method for submatrix operations in a neural network. The example method may include receiving, by a controller unit, a submatrix instruction, wherein the submatrix instruction includes a starting address of a submatrix of a matrix, a width of the submatrix, a height of the submatrix, and a stride that indicates a position of the submatrix relative to the matrix; and selecting, by a computation module, one or more values from the matrix as elements of the submatrix in accordance with the starting address of the submatrix, the width of the submatrix, the height of the submatrix, and the stride.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purpose of explanation, numerous specific details are set forth in order to provide a thorough understanding of one or more aspects. It may be evident, however, that such aspect(s) may be practiced without these specific details.

In the present disclosure, the term "comprising" and "including" as well as their derivatives mean to contain rather than limit; the term "or", which is also inclusive, means and/or.

In this specification, the following various embodiments used to illustrate principles of the present disclosure are only for illustrative purpose, and thus should not be understood as limiting the scope of the present disclosure by any means. The following description taken in conjunction with the accompanying drawings is to facilitate a thorough understanding to the illustrative embodiments of the present disclosure defined by the claims and its equivalent. There are specific details in the following description to facilitate understanding. However, these details are only for illustrative purpose. Therefore, persons skilled in the art should understand that various alternation and modification may be made to the embodiments illustrated in this description without going beyond the scope and spirit of the present disclosure. In addition, for clear and concise purpose, some known functionality and structure are not described. Besides, identical reference numbers refer to identical function and operation throughout the accompanying drawings.

A matrix may include one or more values formatted in a two-dimensional data structure. The one or more values of the matrix may be referred to as matrix elements. A portion of the matrix elements that are similarly formatted in a two-dimensional data structure may be referred to as a submatrix. The values included in the submatrix may be referred to as submatrix elements.

Figure 1:
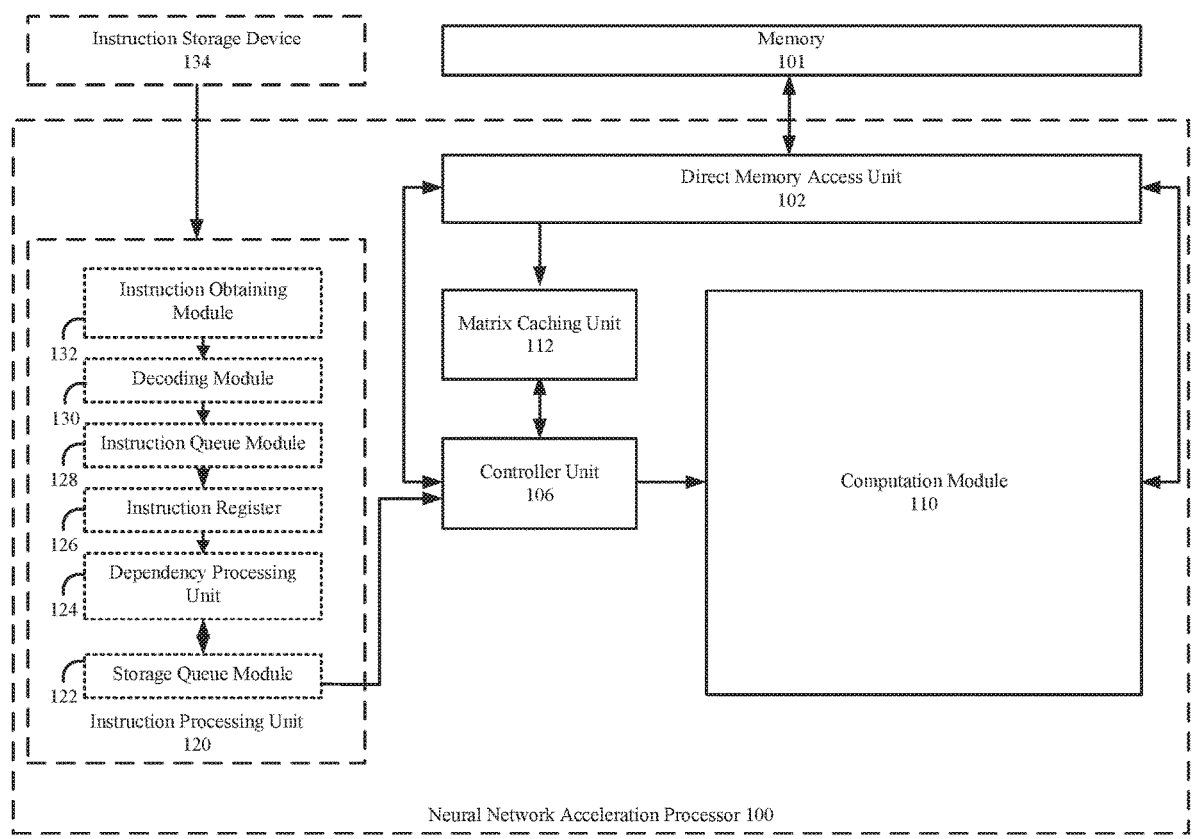
FIG. 1 illustrates a block diagram of an example neural network acceleration processor by which submatrix operations may be implemented in a neural network.

FIG. 1 illustrates a block diagram of an example neural network acceleration processor by which submatrix operations may be implemented in a neural network. As depicted, the example neural network acceleration processor 100 may include an instruction register 126, a controller unit 106, a direct memory access unit 102, a computation module 110, and a matrix caching unit 112. Any of the above-mentioned components or devices may be implemented by a hardware circuit (e.g., application specific integrated circuit (ASIC), Coarse-grained reconfigurable architectures (CGRAs), field-programmable gate arrays (FPGAs), analog circuits, memristor, etc.).

In some examples, a submatrix operation instruction may originate from an instruction storage device 134. An instruction obtaining module 132 may be configured to obtain an instruction from the instruction storage device 134 and transmit the instruction to a decoding module 130.

The decoding module 130 may be configured to decode the instruction. The instruction may include one or more operation fields that indicate parameters for executing the instruction. The parameters may refer to identification numbers of different registers ("register ID" hereinafter) in the instruction register 126. Thus, by modifying the parameters in the instruction register 126, the neural network acceleration processor 100 may modify the instruction without receiving new instructions. The decoded instruction may be transmitted by the decoding module 130 to an instruction queue module 128.

The instruction queue module 128 may be configured to temporarily store the received instruction and/or one or more previously received instructions. Further, the instruction queue module 128 may be configured to retrieve information according to the register IDs included in the instruction from the instruction register 126.

For example, the instruction queue module 128 may be configured to retrieve information corresponding to operation fields in the instruction from the instruction register 126. Information for the operation fields in a SMMV instruction, for example, may include a starting address of a vector, a length of a vector, a starting address of the submatrix, a width of the submatrix, a height of the submatrix, and a stride that indicates a position of the submatrix relative to a matrix. The instruction register 126 may be further configured to store scalar values for the instruction. Once the relevant values are retrieved, the instruction may be sent to a dependency processing unit 124.

The dependency processing unit 124 may be configured to determine whether the instruction has a dependency relationship with the data of the previous instruction that is being executed. This instruction may be stored in the storage queue module 122 until it has no dependency relationship on the data with the previous instruction that has not finished executing. If the dependency relationship does not exist, the instruction may be sent to the controller unit 106 of the neural network acceleration processor 100.

The controller unit 106 may be configured to receive various submatrix operation instructions from the storage queue module 122.

For example, the controller unit 106 may receive a submatrix-multiply-vector (SMMV) instruction that instructs the computation module 110 to multiply a submatrix with a vector. The vector and the submatrix may be respectively identified by the information included in the instruction. For example, the SMMV instruction may include register IDs that indicate one or more registers. The one or more registers in the instruction register 126 may be configured to store a starting address of a vector, a length of a vector, a starting address of the submatrix, a width of the submatrix, a height of the submatrix, and a stride that indicates a position of the submatrix relative to the matrix. The length of the vector may refer to a count of elements in the vector. The submatrix may be selected from a matrix by the computation module 110 accordingly. The width of the submatrix may refer to a count of elements in a row vector of the submatrix. The height of the submatrix may refer to a count of element in a column vector of the submatrix.

In some other examples, the controller unit 106 may receive a vector-multiply-submatrix (VMSM) instruction that instructs the computation module 110 to multiply a vector with a submatrix. For example, the VMSM instruction may include a starting address of a vector, a length of a vector, a starting address of the submatrix, a width of the submatrix, a height of the submatrix, and a stride that indicates a position of the submatrix relative to the matrix.

In some other example, the controller unit 106 may receive a submatrix-multiply-scalar (SMMS) instruction that instructs the computation module 110 to multiply a submatrix with a scalar value. For example, the SMMS instruction may include a scalar value, a starting address of the submatrix, a width of the submatrix, a height of the submatrix, and a stride that indicates a position of the submatrix relative to the matrix.

In some other example, the controller unit 106 may receive a TENS instruction that instructs the computation module 110 to calculate a Kronecker product between two matrices. For example, the TENS instruction may include a starting address of a first submatrix, a width of the first submatrix, a height of the first submatrix, a stride that indicates a position of the first submatrix relative to a first matrix, a starting address of a second submatrix, a width of the second submatrix, a height of the second submatrix, a stride that indicates a position of the second submatrix relative to a second matrix. In some respects, the first matrix and the second matrix may refer to a same matrix. In other words, the first submatrix and the second submatrix may be selected from the same matrix.

In some other examples, the controller unit 106 may receive a submatrix-addition (SMA) instruction that instructs the computation module 110 to add two submatrices. For example, the SMA instruction may include a starting address of a first submatrix, a width of the first submatrix, a height of the first submatrix, a stride that indicates a position of the first submatrix relative to a first matrix, a starting address of a second submatrix, a width of the second submatrix, a height of the second submatrix, a stride that indicates a position of the second submatrix relative to a second matrix. In some respects, the first matrix and the second matrix may refer to a same matrix.

In some other examples, the controller unit 106 may receive a submatrix-subtraction (SMS) instruction that instructs the computation module 110 to subtract one submatrix from another submatrix. For example, the SMS instruction may include a starting address of a first submatrix, a width of the first submatrix, a height of the first submatrix, a stride that indicates a position of the first submatrix relative to a first matrix, a starting address of a second submatrix, a width of the second submatrix, a height of the second submatrix, a stride that indicates a position of the second submatrix relative to a second matrix. In some respects, the first matrix and the second matrix may refer to a same matrix.

In some other examples, the controller unit 106 may receive a submatrix-multiply-submatrix (SMM) instruction that instructs the computation module 110 to multiply two matrices. Similarly, the SMM instruction may include a starting address of a first submatrix, a width of the first submatrix, a height of the first submatrix, a stride that indicates a position of the first submatrix relative to a first matrix, a starting address of a second matrix, a width of the second submatrix, a height of the second submatrix, a stride that indicates a position of the second submatrix relative to a second matrix.

In some other examples, the controller unit 106 may receive a convolution (CONV) instruction that instructs the computation module 110 to convolute a submatrix with a convolution kernel. The CONV instruction may include a starting address of the convolution kernel, a length of the convolution kernel, a starting address of the submatrix, a width of the submatrix, a height of the submatrix, and a stride that indicates a position of the submatrix relative to a matrix.

In some other examples, the controller unit 106 may receive a submatrix-move (SMMOVE) instruction that instructs the computation module 110 to move a submatrix from a first address to a second address in the matrix caching unit 112. For example, the SMMOVE instruction may include a starting address of the submatrix, a width of the submatrix, a height of the submatrix, a stride that indicates a position of the submatrix relative to a matrix, and a target address in the matrix caching unit 112.

According to the above-mentioned submatrix operation instructions, the computation module 110 may be configured to select the submatrix from the matrix stored in an external storage device, e.g., the memory 101.

Hereinafter, a caching unit (e.g., the instruction register 126, the matrix caching unit 112, etc.) may refer to an on-chip caching unit integrated in the neural network acceleration processor 100, rather than other storage devices in memory 101 or other external devices. In some examples, the on-chip caching unit may be implemented as a register file, an on-chip buffer, an on-chip Static Random Access Memory (SRAM), or other types of on-chip storage devices that may provide higher access speed than the external memory. In some other examples, the instruction register 126 may be implemented as a scratchpad memory, e.g., Dynamic random-access memory (DRAM), embedded DRAM (eDRAM), memristor, 3D-DRAM, non-volatile memory, etc.

Figure 2A:
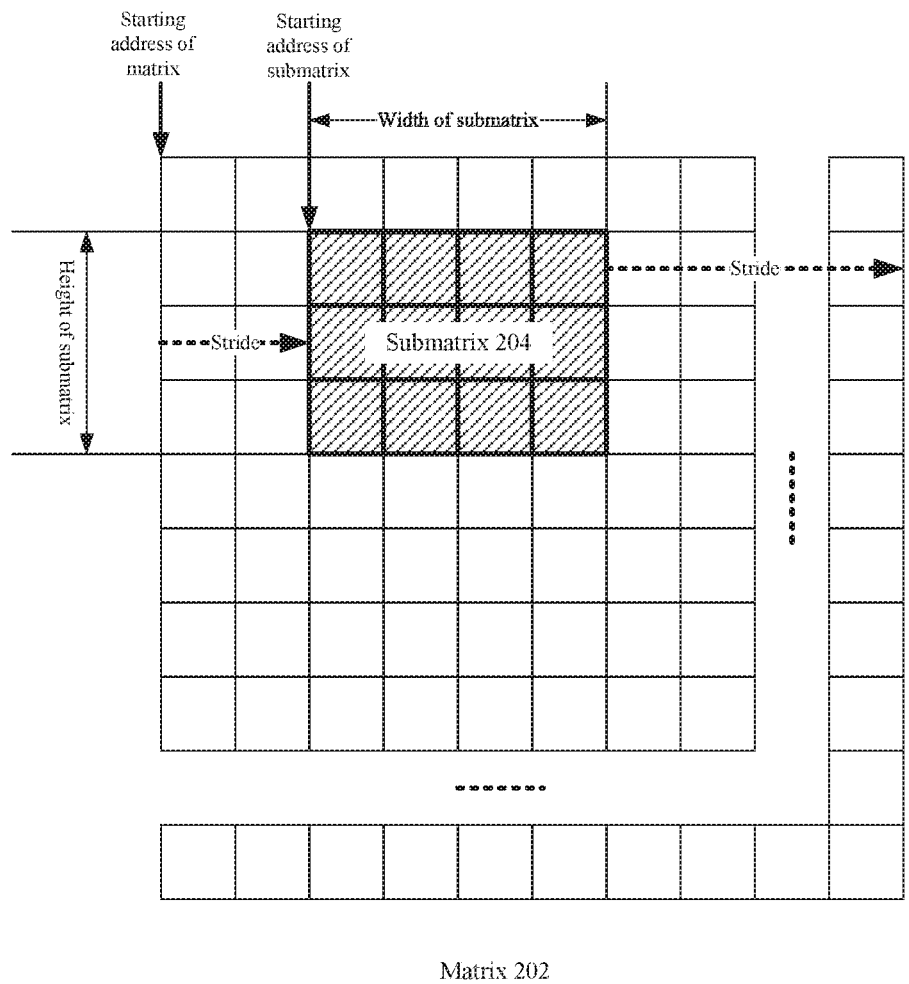
FIG. 2A illustrates a process for selecting a submatrix from a matrix that may be performed by the example network acceleration processor.

FIG. 2A illustrates a process for selecting a submatrix from a matrix that may be performed by the example network acceleration processor.

Figure 2B:
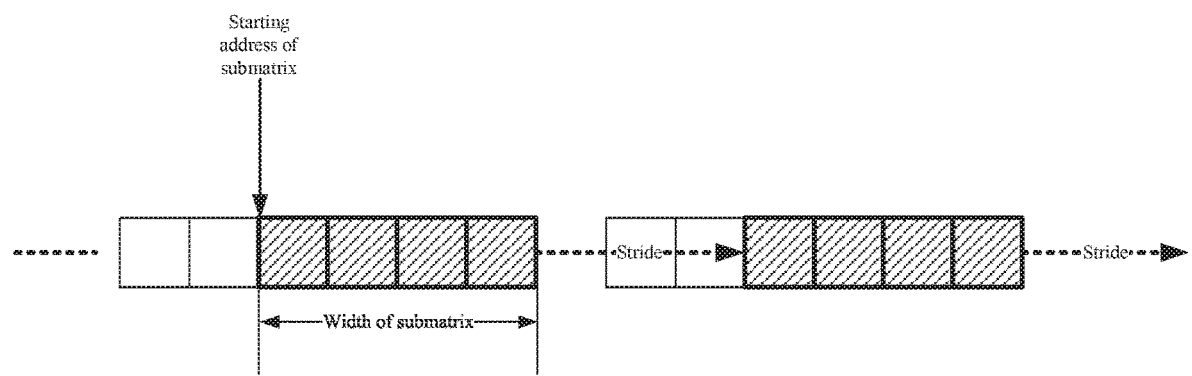
FIG. 2B further illustrates the process for selecting a submatrix from a matrix that may be performed by the example network acceleration processor.

Upon receiving a submatrix operation instruction, the computation module 110 may be configured to select one or more matrix elements of a matrix 202 as submatrix elements of a submatrix 204. The matrix 202 is depicted in a two-dimensional data structure in FIG. 2A; however, elements of the matrix 202 may be stored in a one-dimensional data as shown in FIG. 2B.

As described above, the submatrix operation instruction may include a starting address of the submatrix 204, a width of the submatrix 204, a height of the submatrix 204, and a stride that indicates a position of the submatrix 204 relative to the matrix 202. The width of the submatrix 204 may refer to a count of elements in a row vector of the submatrix 204. The height of the submatrix 204 may refer to a count of elements in a column vector of the submatrix.

In some examples, the computation module 110 may be configured to consecutively read a first number of elements from the starting address of the matrix 202 and then skip a second number of elements. The first number of the read elements may be the width of the submatrix 204 included in the submatrix operation instruction. The second number of the skipped elements may be the stride included in the submatrix operation instruction.

Subsequent to skipping the second number of elements, the computation module 110 may be configured to again consecutively read a first number of elements. The process may be repeated until the number of the consecutive readings equals to the height of the submatrix 204.

FIG. 2B further illustrates the process for selecting a submatrix from a matrix that may be performed by the example network acceleration processor.

As described above, the matrix 202 may be stored as a one-dimensional data structure in the memory 101 as shown here. Similarly, the computation module 110 may be configured to consecutively read a first number of elements from the starting address of the matrix 202 and then skip a second number of elements. The first number of the read elements may be the width of the submatrix 204 included in the submatrix operation instruction. The second number of the skipped elements may be the stride included in the submatrix operation instruction.

Subsequent to skipping the second number of elements, the computation module 110 may be configured to again consecutively read a first number of elements. The process may be repeated until the number of the consecutive readings equals to the height of the submatrix 204.

Figure 3:
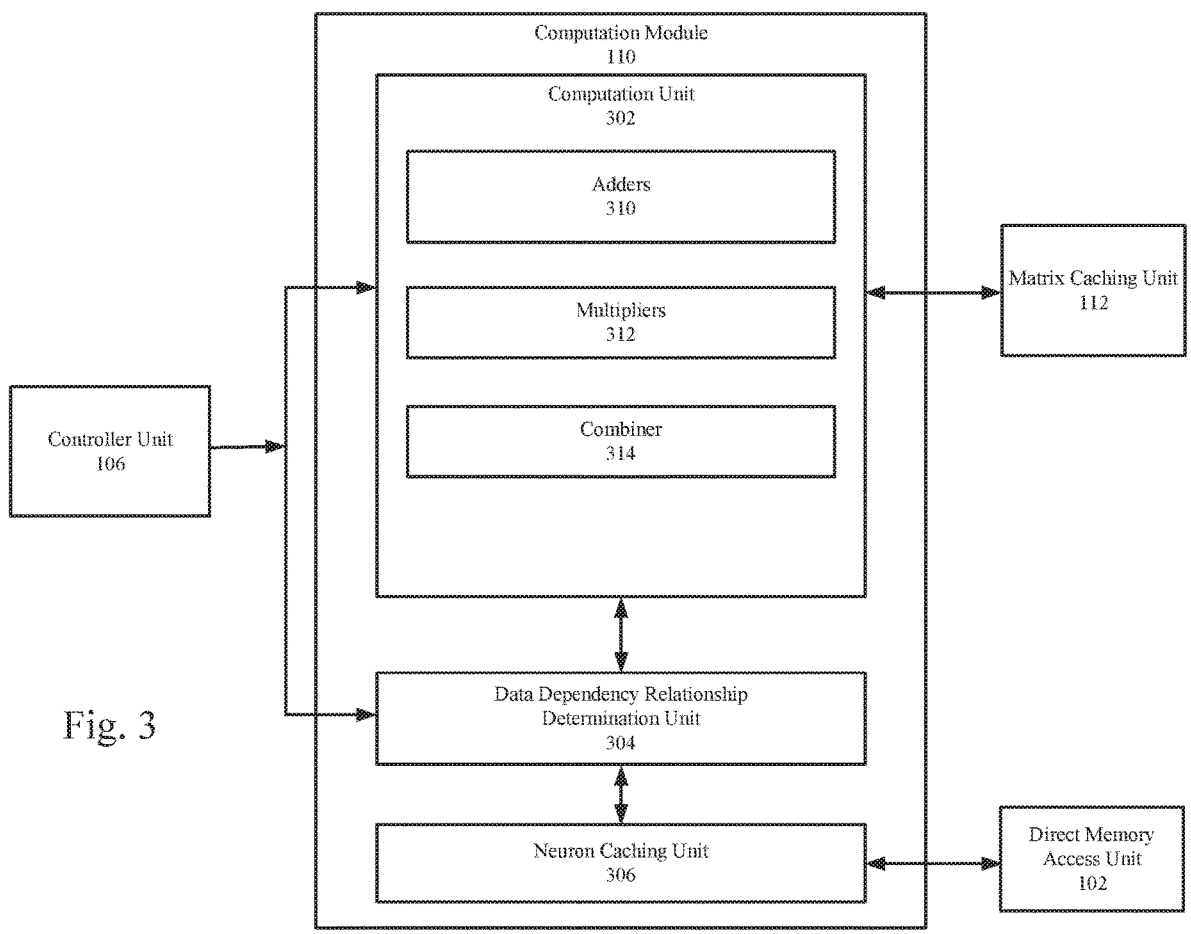
FIG. 3 illustrates an example computation module in the example neural network acceleration processor by which submatrix operations may be implemented in a neural network.

FIG. 3 illustrates an example computation module in the example neural network acceleration processor by which submatrix operations may be implemented in a neural network. As depicted, the computation module 110 may include a computation unit 302, a data dependency relationship determination unit 304, a neuron caching unit 306. The computation unit 302 may further include one or more adders 310, one or more multipliers 312, and a combiner 314. The components described in accordance with FIG. 3 may be implemented by hardware, software, firmware, or any combination thereof.

The data dependency relationship determination unit 304 may be configured to perform data access operations (e.g., reading or writing operations) on the caching units including the neuron caching unit 306 during the computation process. The data dependency relationship determination unit 304 may be configured to prevent conflicts in reading and writing of the data in the caching units. For example, the data dependency relationship determination unit 304 may be configured to determine whether there is dependency relationship in terms of data between a micro-instruction which to be executed and a micro-instruction being executed. If no dependency relationship exists, the micro-instruction may be allowed to be executed; otherwise, the micro-instruction may not be allowed to be executed until all micro-instructions on which it depends have been executed completely. The dependency relationship may be determined when a target operation range of the micro-instruction to be executed overlaps a target operation range of a micro-instruction being executed. For example, all micro-instructions sent to the data dependency relationship determination unit 304 may be stored in an instruction queue within the data dependency relationship determination unit 304. The instruction queue may indicate the relative priorities of the stored micro-instructions. In the instruction queue, if the target operation range of reading data by a reading instruction conflicts with or overlaps the target operation range of writing data by a writing instruction of higher priority in the front of the instruction queue, then the reading instruction may not be executed until the writing instruction is executed.

The neuron caching unit 306 may be configured to store the elements in the vector and the submatrices, or the scalar values for the submatrix operations.

The computation unit 302 may be configured to receive the micro-instructions decoded from the vector operation instruction from the controller unit 106. In response to a SMMV instruction, the multipliers 312 may be configured to respectively multiply the row vectors in the submatrix with the vector. The multiplication results may be combined by the combiner 314 into an output vector.

In response to a VMSM instruction, the multipliers 312 may be configured to respectively multiply the vector with the one or more column vectors in the submatrix. The multiplication results may be combined by the combiner 314 into an output vector.

In response to a SMMS instruction, the multipliers 312 may be configured to respectively multiply each element in the submatrix with the scalar value. The multiplication results may be output as a matrix.

In response to a TENS instruction, the multipliers 312 may be configured to respectively multiply each element in a first submatrix with a second matrix. The multiplication results (e.g., multiple matrices) may be combined in to an output matrix by the combiner 314.

In response to a SMA instruction, the adders 310 may be configured to respectively add corresponding elements in two submatrices. The addition results may be combined and output as an output matrix by the combiner 314.

In response to a SMS instruction, an inverter of the computation unit 302 may be configured to invert the elements in a first submatrix. The adders 310 may be configured to add elements in a second submatrix to the inverted elements in the first matrix. The results of the addition may be combined and output as an output matrix by the combiner 314.

In response to a SMM instruction, the multipliers 312 may be configured to respectively multiply elements in a first submatrix with elements in a second matrix to perform a matrix multiplication. The results of the multiplication may be combined into an output matrix.

In response to a CONV instruction, the computation unit 302 may be configured to retrieve a convolution kernel from the matrix caching unit 112. The convolution kernel may refer to a matrix of the same width and same height as the selected submatrix. The multipliers 312 may be configured to respectively multiply elements in the selected submatrix with elements in the convolution kernel. The one or more multiplication results may be added, by the adders 310, to generate a partial result. The computation unit 302 may be configured to store the partial result in the neuron caching unit 306 or the matrix caching unit 112.

Subsequently, the computation unit 302 may be configured to retrieve another submatrix from the same matrix in accordance with an increment on the starting address of the previously selected submatrix. The increment may be included in the CONV instruction or may be predetermined and stored in the computation module 110. Similarly, the multipliers 312 may be configured to respectively multiply elements in the currently selected submatrix with elements in the convolution kernel. The multiplication results may be added, by the adders 310, to generate another partial result. Such process may be repeated until the convolution kernel is multiplied with every submatrix in the matrix. The multiple partial results may be added to generate an output result.

In response to a SMMOVE instruction, the computation unit 302 may be configured to move a submatrix from a source address in the matrix caching unit 112 to a target address in the matrix caching unit 112.

Figure 4:
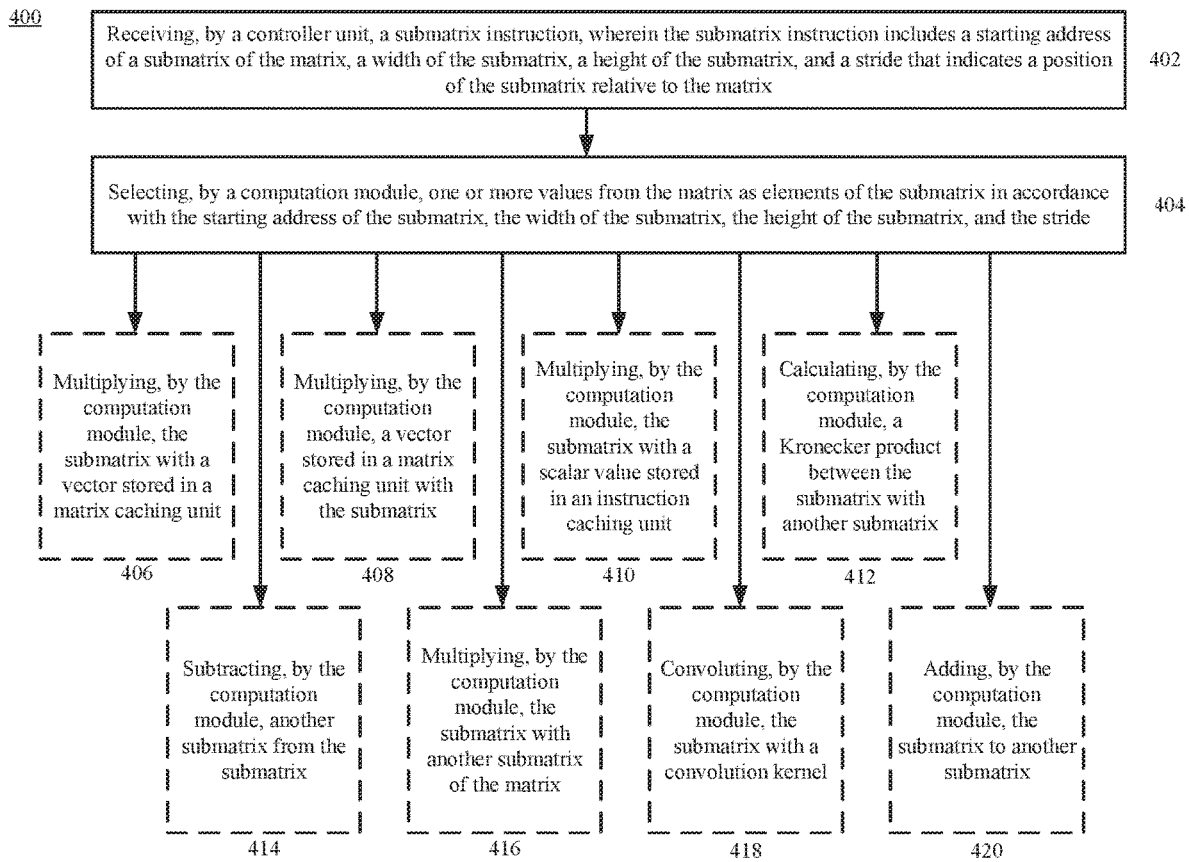
FIG. 4 illustrates a flow chart of an example method for performing submatrix operations in a neural network.

FIG. 4 illustrates a flow chart of an example method 400 for performing submatrix operations in a neural network. The example method 400 may be performed by one or more components described in FIGS. 1 and 3.

At block 402, the example method 400 may include receiving, by a controller unit, a submatrix instruction, wherein the submatrix instruction includes a starting address of a submatrix of the matrix, a width of the submatrix, a height of the submatrix, and a stride that indicates a position of the submatrix relative to the matrix. For example, the computation module 110 may be configured to receive a submatrix operation instruction from the controller unit 106. The submatrix operation instruction may include a starting address of the submatrix, a width of the submatrix, a height of the submatrix, and a stride that indicates a position of the submatrix relative to the matrix.

At block 404, the example method 400 may include selecting, by a computation module, one or more values from the matrix as elements of the submatrix in accordance with the starting address of the submatrix, the width of the submatrix, the height of the submatrix, and the stride. For example, the computation module 110 may be configured to select one or more values from the matrix as the elements of the submatrix. For example, the computation module 110 may be configured to consecutively read a first number of elements from the starting address of the matrix 202 and then skip a second number of elements. The first number of the read elements may be the width of the submatrix 204 included in the submatrix operation instruction. The second number of the skipped elements may be the stride included in the submatrix operation instruction.

Subsequent to skipping the second number of elements, the computation module 110 may be configured to again consecutively read a first number of elements. The process may be repeated until the number of the consecutive readings equals to the height of the submatrix 204.

At block 406, the example method 400 may optionally include multiplying, by the computation module, the submatrix with a vector stored in a matrix caching unit. For example, in response to a SMMV instruction, the multipliers 312 may be configured to respectively multiply the row vectors in the submatrix with the vector. The multiplication results may be combined by the combiner 314 into an output vector.

At block 408, the example method 400 may optionally include multiplying, by the computation module, a vector stored in a matrix caching unit with the submatrix. For example, in response to a VMSM instruction, the multipliers 312 may be configured to respectively multiply the vector with the one or more column vectors in the submatrix. The multiplication results may be combined by the combiner 314 into an output vector.

At block 410, the example method 400 may optionally include multiplying, by the computation module, the submatrix with a scalar value stored in an instruction register. For example, in response to a SMMS instruction, the multipliers 312 may be configured to respectively multiply each element in the submatrix with the scalar value. The multiplication results may be output as a matrix.

At block 412, the example method 400 may optionally include calculating, by the computation module, a Kronecker product between the submatrix with another submatrix. For example, in response to a TENS instruction, the multipliers 312 may be configured to respectively multiply each element in a first submatrix with a second matrix. The multiplication results (e.g., multiple matrices) may be combined in to an output matrix by the combiner 314.

At block 414, the example method 400 may optionally include adding, by the computation module, the submatrix to another submatrix. For example, in response to a SMA instruction, the adders 310 may be configured to respectively add corresponding elements in two submatrices. The addition results may be combined and output as an output matrix by the combiner 314.

At block 416, the example method 400 may optionally include subtracting, by the computation module, another submatrix from the submatrix. For example, in response to a SMS instruction, an inverter of the computation unit 302 may be configured to invert the elements in a first submatrix. The adders 310 may be configured to add elements in a second submatrix to the inverted elements in the first matrix. The results of the addition may be combined and output as an output matrix by the combiner 314.

At block 418, the example method 400 may optionally include multiplying, by the computation module, the submatrix with another submatrix of the matrix. For example, in response to a SMM instruction, the multipliers 312 may be configured to respectively multiply elements in a first submatrix with elements in a second matrix to perform a matrix multiplication. The results of the multiplication may be combined into an output matrix.

At block 420, the example method 400 may optionally include convoluting, by the computation module, the submatrix with a convolution kernel. For example, in response to a CONV instruction, the multipliers 312 may be configured to respectively multiply elements in a submatrix with elements in a convolution kernel. The results of the multiplication may be combined into an output matrix.

The process or method described in the above accompanying figures can be performed by process logic including hardware (for example, circuit, specific logic etc.), firmware, software (for example, a software being externalized in non-transitory computer-readable medium), or the combination of the above two. Although the process or method is described above in a certain order, it should be understood that some operations described may also be performed in different orders. In addition, some operations may be executed concurrently rather than in order.

In the above description, each embodiment of the present disclosure is illustrated with reference to certain illustrative embodiments. Apparently, various modifications may be made to each embodiment without going beyond the wider spirit and scope of the present disclosure presented by the affiliated claims. Correspondingly, the description and accompanying figures should be understood as illustration only rather than limitation. It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

We claim:

1. An apparatus for submatrix operations in a neural network, comprising:
    a controller unit configured to receive a submatrix instruction, wherein the submatrix instruction includes a starting address of a submatrix of a matrix, a width of the submatrix, a height of the submatrix, and a stride that indicates a position of the submatrix relative to the matrix,
    wherein the submatrix instruction is an instruction selected from a group consisting of a submatrix-multiply-vector (SMMV) instruction, a vector-multiply-submatrix (VMSM) instruction, a submatrix-multiply-scalar (SMMS) instruction, a TENS instruction, a submatrix-addition (SMA) instruction, a submatrix-subtraction (SMS) instruction, a submatrix-multiply-submatrix (SMM) instruction, a convolution (CONV) instruction, and a submatrix-move (SMMOVE) instruction; and
    a computation module configured to select one or more values from the matrix as elements of the submatrix in accordance with the starting address of the submatrix, the width of the submatrix, the height of the submatrix, and the stride.

2. The apparatus of claim 1, further comprising a matrix caching unit configured to store the matrix that includes one or more matrix elements.

3. The apparatus of claim 1, further comprising an instruction register configured to store the starting address of the submatrix, the width of the submatrix, the height of the submatrix, and the stride.

4. The apparatus of claim 1,
wherein the SMMV instruction further includes a first address of a first vector and a first output address for storing a first output vector,
wherein the VMSM instruction further includes a second address of a second vector and a second output address for storing a second output vector,
wherein the SMMS instruction further includes a third address of a scalar value and a third output address for storing a third output matrix,
wherein the TENS instruction further includes a fourth address of an additional submatrix and a fourth output address for storing a fourth output matrix,
wherein the SMA instruction further includes a fifth address of an additional submatrix and a fifth output address for storing a fifth output matrix,
wherein the SMS instruction further includes a sixth address of an additional submatrix and a sixth output address for storing a sixth output matrix,
wherein the SMM instruction further includes a seventh address of an additional submatrix and a seventh output address for storing a seventh output matrix,
wherein the CONV instruction further includes an eighth address of an additional submatrix and an eighth output address for storing an eighth output matrix, and
wherein the SMMOVE instruction further includes a target address for storing the moved submatrix.

5. The apparatus of claim 1, wherein the computation module is further configured to
retrieve, in response to the submatrix instruction, a vector from a matrix caching unit, wherein the submatrix instruction is the SMMV instruction that further includes a first address of the vector in the matrix caching unit and a length of the vector;
multiply the submatrix with the vector to generate an output vector in response to the SMMV instruction; and
store the output vector in the matrix caching unit to a second address included in the SMMV instruction.

6. The apparatus of claim 1, wherein the computation module is further configured to
retrieve, in response to the submatrix instruction, a vector from a matrix caching unit, wherein the submatrix instruction is the VMSM instruction that further includes a first address of the vector in the matrix caching unit;
multiply the vector with the submatrix to generate an output vector; and
store the output vector in the matrix caching unit to a second address included in the VMSM instruction.

7. The apparatus of claim 1, wherein the computation module is further configured to
retrieve, in response to the submatrix instruction, a scalar value from an instruction register, wherein the submatrix instruction is the SMMS instruction that further includes an address of the scalar value in the instruction register;
multiply the submatrix with the scalar value to generate an output matrix in response to the SMMS instruction; and
store the output matrix in a matrix caching unit according to an output address included in the SMMS instruction.

8. The apparatus of claim 1, wherein the computation module is further configured to
retrieve, in response to the submatrix instruction, an additional submatrix from a matrix caching unit, wherein the submatrix instruction is the TENS instruction that further includes a starting address of the additional submatrix of the matrix, a width of the additional submatrix, a height of the additional submatrix, and a stride that indicates a position of the additional submatrix relative to a matrix;
calculate a Kronecker product between the submatrix with the additional submatrix to generate an output matrix in response to the TENS instruction; and
store the output matrix in the matrix caching unit according to an output address included in the TENS instruction.

9. The apparatus of claim 1, wherein the computation module is further configured to
retrieve, in response to the submatrix instruction, an additional submatrix from a matrix caching unit, wherein the submatrix instruction is the SMA instruction that further includes a starting address of the additional submatrix of the matrix, a width of the additional submatrix, a height of the additional submatrix, and a stride that indicates a position of the additional submatrix relative to a matrix;
add the submatrix to the additional submatrix to generate an output matrix in response to the SMA instruction; and
store the output matrix in the matrix caching unit.

10. The apparatus of claim 4, wherein the computation module is further configured to
retrieve, in response to the submatrix instruction, an additional submatrix from a matrix caching unit, wherein the submatrix instruction is the SMS instruction that further includes a starting address of the additional submatrix of the matrix, a width of the additional submatrix, a height of the additional submatrix, and a stride that indicates a position of the additional submatrix relative to a matrix;
subtract the additional submatrix from the submatrix to generate an output matrix in response to the SMS instruction; and
store the output matrix in the matrix caching unit.

11. The apparatus of claim 4, wherein the computation module is configured to
retrieve, in response to the submatrix instruction, an additional submatrix of the matrix from a matrix caching unit, wherein the submatrix is the SMM instruction that further includes a starting address of the additional submatrix of the matrix, a width of the additional submatrix, a height of the additional submatrix, and a stride that indicates a position of the additional submatrix relative to a matrix;
multiply the submatrix with the additional submatrix to generate an output matrix in response to the SMM instruction; and
store the output matrix in the matrix caching unit.

12. The apparatus of claim 4, wherein the computation module is configured to
retrieve, in response to the submatrix instruction, a convolution kernel from a matrix caching unit, wherein the submatrix is the CONV instruction that further includes a starting address of the convolution kernel and a length of the convolution kernel;
respectively multiply elements in the submatrix with elements in the convolution kernel to generate one or more first multiplication results in response to the CONV instruction;

add the one or more first multiplication results to generate a first partial result; and
store the first partial result in the matrix caching unit.

13. The apparatus of claim 12, wherein the computation module is further configured to
retrieve a next submatrix of the matrix in accordance with an increment on the starting address of the submatrix of the matrix;
respectively multiply elements in the next submatrix with elements in the convolution kernel to generate one or more second multiplication results;
add the one or more second multiplication results to generate a second partial result;
store the second partial result in the matrix caching unit; and
add the first partial result to the second partial result.

14. The apparatus of claim 4, wherein the computation module is configured to move, in response to the submatrix instruction, the elements in the submatrix from the starting address to a target address, wherein the submatrix instruction is the SMMOVE instruction that further includes the target address in the matrix caching unit.

15. A method for submatrix operations in a neural network, comprising:
receiving, by a controller unit, a submatrix instruction, wherein the submatrix instruction includes a starting address of a submatrix of a matrix, a width of the submatrix, a height of the submatrix, and a stride that indicates a position of the submatrix relative to the matrix,
wherein the submatrix instruction is an instruction selected from a submatrix-multiply-vector (SMMV) instruction, a vector-multiply-submatrix (VMSM) instruction, a submatrix-multiply-scalar (SMMS) instruction, a TENS instruction, a submatrix-addition (SMA) instruction, a submatrix-subtraction (SMS) instruction, a submatrix-multiply-submatrix (SMM) instruction, a convolution (CONV) instruction, and a submatrix-move (SMMOVE) instruction; and
selecting, by a computation module, one or more values from the matrix as elements of the submatrix in accordance with the starting address of the submatrix, the width of the submatrix, the height of the submatrix, and the stride.

16. The method of claim 15, further comprising storing, by a matrix caching unit, the matrix that includes one or more matrix elements.

17. The method of claim 15, further comprising storing, by an instruction register, the starting address of the submatrix, the width of the submatrix, the height of the submatrix, and the stride.

18. The method of claim 15,
wherein the SMMV instruction further includes a first address of a first vector and a first output address for storing a first output vector,
wherein the VMSM instruction further includes a second address of a second vector and a second output address for storing a second output vector,
wherein the SMMS instruction further includes a third address of a scalar value and a third output address for storing a third output matrix,
wherein the TENS instruction further includes a fourth address of an additional submatrix and a fourth output address for storing a fourth output matrix,
wherein the SMA instruction further includes a fifth address of an additional submatrix and a fifth output address for storing a fifth output matrix,
wherein the SMS instruction further includes a sixth address of an additional submatrix and a sixth output address for storing a sixth output matrix,
wherein the SMM instruction further includes a seventh address of an additional submatrix and a seventh output address for storing a seventh output matrix,
wherein the CONV instruction further includes an eighth address of an additional submatrix and an eighth output address for storing an eighth output matrix, and
wherein the SMMOVE instruction further includes a target address for storing the moved submatrix.

19. The method of claim 15, further comprising:
retrieving, in response to the submatrix instruction, by the computation module, a vector from a matrix caching unit, wherein the submatrix instruction is the SMMV instruction that further includes a first address of the vector in the matrix caching unit and a length of the vector;
multiplying, by the computation module, the submatrix with the vector to generate an output vector in response to the SMMV instruction; and
storing, by the computation module, the output vector in the matrix caching unit to a second address included in the SMMV instruction.

20. The method of claim 15, further comprising:
retrieving, in response to the submatrix instruction, by the computation module, a vector from a matrix caching unit, wherein the submatrix instruction is the VMSM instruction that further includes a first address of the vector in the matrix caching unit;
multiplying, by the computation module, the vector with the submatrix to generate an output vector in response to the VMSM instruction; and
storing, by the computation module, the output vector in the matrix caching unit to a second address included in the VMSM instruction.

21. The method of claim 15, further comprising:
retrieving, in response to the submatrix instruction, by the computation module, a scalar value from an instruction register, wherein the submatrix instruction is the SMMS instruction that further includes an address of the scalar value in the instruction register;
multiplying, by the computation module, the submatrix with the scalar value to generate an output matrix in response to the SMMS instruction; and
storing, by the computation module, the output matrix in a matrix caching unit according to an output address included in the SMMS instruction.

22. The method of claim 15, further comprising:
retrieving, in response to the submatrix instruction, by the computation module, an additional submatrix from a matrix caching unit, wherein the submatrix instruction is the TENS instruction that further includes a starting address of the additional submatrix of the matrix, a width of the additional submatrix, a height of the additional submatrix, and a stride that indicates a position of the additional submatrix relative to a matrix;
calculating, by the computation module, a Kronecker product between the submatrix with the additional submatrix to generate an output matrix in response to the TENS instruction; and
storing, by the computation module, the output matrix in the matrix caching unit according to an output address included in the TENS instruction.

23. The method of claim 15, further comprising:
retrieving, in response to the submatrix instruction, by the computation module, an additional submatrix from a matrix caching unit, wherein the submatrix instruction is the SMA instruction that further includes a starting address of the additional submatrix of the matrix, a width of the additional submatrix, a height of the additional submatrix, and a stride that indicates a position of the additional submatrix relative to a matrix;
adding, by the computation module, the submatrix to the additional submatrix to generate an output matrix in response to the SMA instruction; and
storing, by the computation module, the output matrix in the matrix caching unit.

24. The method of claim 15, further comprising:
retrieving, in response to the submatrix instruction, by the computation module, an additional submatrix from a matrix caching unit;
subtracting, by the computation module, the additional submatrix from the submatrix to generate an output matrix in response to the SMS instruction, wherein the submatrix instruction is the SMS instruction that further includes a starting address of the additional submatrix of the matrix, a width of the additional submatrix, a height of the additional submatrix, and a stride that indicates a position of the additional submatrix relative to a matrix; and
storing, by the computation module, the output matrix in the matrix caching unit.

25. The method of claim 15, further comprising:
retrieving, in response to the submatrix instruction, by the computation module, an additional submatrix of the matrix from a matrix caching unit, wherein the submatrix is the SMM instruction that further includes a starting address of the additional submatrix of the matrix, a width of the additional submatrix, a height of the additional submatrix, and a stride that indicates a position of the additional submatrix relative to a matrix;
multiplying, by the computation module, the submatrix with the additional submatrix to generate an output matrix in response to the SMM instruction; and
storing, by the computation module, the output matrix in the matrix caching unit.

26. The method of claim 15, further comprising:
retrieving, in response to the submatrix instruction, by the computation module, a convolution kernel from a matrix caching unit, wherein the submatrix is the CONV instruction that further includes a starting address of the convolution kernel and a length of the convolution kernel;
respectively multiplying, by the computation module, elements in the submatrix with elements in the convolution kernel to generate one or more first multiplication results in response to the CONV instruction;
adding, by the computation module, the one or more first multiplication results to generate a first partial result; and
storing, by the computation module, the first partial result in the matrix caching unit.

27. The method of claim 15, further comprising moving, in response to the submatrix instruction, by the computation module, the elements in the submatrix from the starting address to a target address, wherein the submatrix instruction is the SMMOVE instruction that further includes the target address in the matrix caching unit.

* * * * *